(12) United States Patent
Weissman et al.

(10) Patent No.: US 9,628,203 B2
(45) Date of Patent: Apr. 18, 2017

(54) ANALOG BUILT-IN SELF TEST TRANSCEIVER

(71) Applicant: QUALCOMM Incorporated, San Diego, CA (US)

(72) Inventors: Haim Mendel Weissman, Haifa (IL); Lior Raviv, Atlit (IL)

(73) Assignee: Qualcomm Incorporated, San Diego, CA (US)

( * ) Notice: Subject to any disclaimer, the term of this patent is extended or adjusted under 35 U.S.C. 154(b) by 73 days.

(21) Appl. No.: 14/196,743

(22) Filed: Mar. 4, 2014

(65) Prior Publication Data

US 2015/0256272 A1   Sep. 10, 2015

(51) Int. Cl.
| | | |
|---|---|---|
| *H04B 1/40* | (2015.01) | |
| *H04B 17/13* | (2015.01) | |
| *H03F 3/21* | (2006.01) | |
| *H03F 3/195* | (2006.01) | |
| *H03F 3/213* | (2006.01) | |
| *H04B 17/21* | (2015.01) | |
| *H04B 17/14* | (2015.01) | |
| *H04B 17/19* | (2015.01) | |

(52) U.S. Cl.
CPC .............. *H04B 17/13* (2015.01); *H03F 3/195* (2013.01); *H03F 3/211* (2013.01); *H03F 3/213* (2013.01); *H04B 1/40* (2013.01); *H04B 17/14* (2015.01); *H04B 17/19* (2015.01); *H04B 17/21* (2015.01); *H03F 2200/421* (2013.01)

(58) Field of Classification Search
CPC ..................................................... H04B 17/21
See application file for complete search history.

(56) References Cited

U.S. PATENT DOCUMENTS

| | | | |
|---|---|---|---|
| 6,346,910 | B1 | 2/2002 | Ito |
| 7,925,229 | B2 | 4/2011 | Eisenstadt et al. |
| 8,139,670 | B1 | 3/2012 | Son et al. |
| 8,140,031 | B2 | 3/2012 | Tsfati et al. |
| 2004/0203472 | A1* | 10/2004 | Chien ...................... H04B 1/30 455/68 |
| 2004/0204105 | A1* | 10/2004 | Liang et al. ............... 455/562.1 |
| 2006/0197538 | A1 | 9/2006 | Leinonen et al. |
| 2010/0093282 | A1* | 4/2010 | Martikkala et al. ......... 455/63.4 |
| 2013/0084852 | A1 | 4/2013 | Duperray |
| 2013/0156085 | A1* | 6/2013 | Nicolson et al. ............. 375/229 |

(Continued)

OTHER PUBLICATIONS

Yoon J.S., et al., "Embedded Loopback Test for RF ICs," IEEE Transactions on Instrumentation and Measurement, vol. 54 (5), Oct. 2005, pp. 1715-1720.

(Continued)

*Primary Examiner* — Hsin-Chun Liao
(74) *Attorney, Agent, or Firm* — Toler Law Group, PC

(57) ABSTRACT

An apparatus includes a first power amplifier coupled to a first transmission path, a first low noise amplifier coupled to a first reception path, a second power amplifier coupled to a second transmission path, and a second low noise amplifier coupled to a second reception path. A first switch is configured to selectively couple the second low noise amplifier to receive an output of the first power amplifier. A second switch is configured to selectively couple the first low noise amplifier to receive an output of the second power amplifier.

19 Claims, 7 Drawing Sheets

(56) References Cited

U.S. PATENT DOCUMENTS

2013/0217343 A1\* 8/2013 Tenbroek .............. H04W 24/00
                                                                                 455/77
2013/0329574 A1 12/2013 Lehtonen et al.

OTHER PUBLICATIONS

Cohen, Emanuel et al., "A CMOS Bidirectional 32-element Phased-Array Transceiver at 60GHz with LTCC Antenna," Radio Frequency Integrated Circuits Symposium (RFIC), 2012 IEEE, Jun. 17-19, 2012, Montreal, QC, pp. 439-442.

Inac, Ozgur et al., "A Phased Array RFIC With Built-In Self-Test Capabilities," IEEE Transactions on Microwave Theory and Techniques, vol. 60, Issue 1, Dec. 2, 2011, pp. 139-148.

International Search Report and Written Opinion for International Application No. PCT/US2015/018517, ISA/EPO, Date of Mailing May 18, 2015, 11 pages.

\* cited by examiner

ANALOG BUILT-IN SELF TEST TRANSCEIVER

I. FIELD

The present disclosure is generally related to an analog built-in self test transceiver.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

A wireless telephone may transmit and receive signals using a transceiver. A front-end of the transceiver may include multiple low noise amplifiers (for signal reception) and multiple power amplifiers (for signal transmission). A built-in self test (BiST) mechanism to test transmission and reception properties (e.g., power, noise figure, linearity, gain, etc.) may be implemented at the back-end of the transceiver. However, a modem at the back-end of the transceiver may be unable to determine characteristics of the amplifiers at the front-end of the transceiver. In addition, the transceiver may not be capable of calibrating the power amplifiers and/or the low noise amplifiers if the BiST mechanism is implemented at the back-end of the transceiver.

III. BRIEF DESCRIPTION OF THE DRAWINGS

IV. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
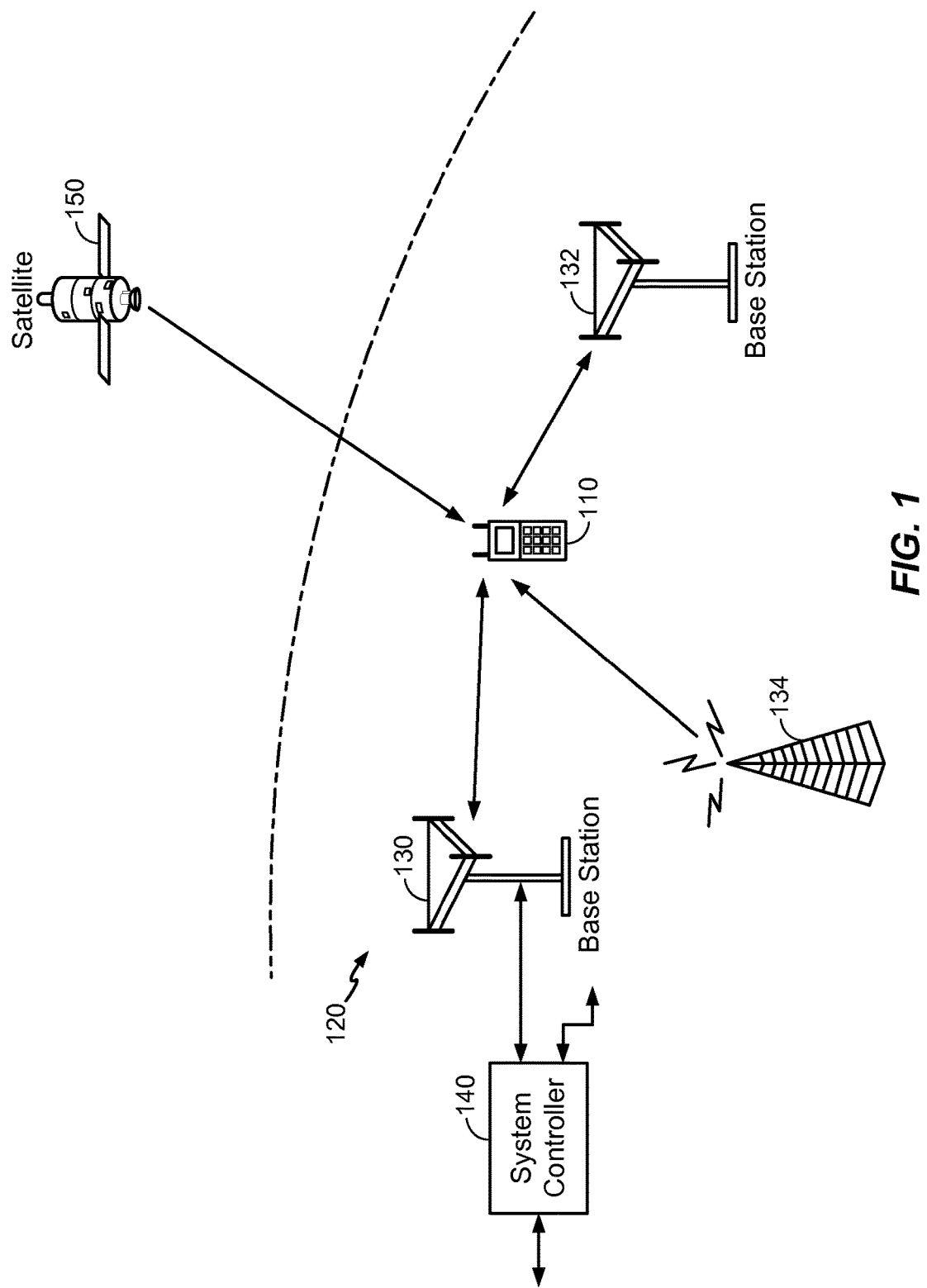
FIG. 1 shows a wireless device communicating with a wireless system.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1×, EVDO, TD-SCDMA, GSM, 802.11, etc.

Figure 2:
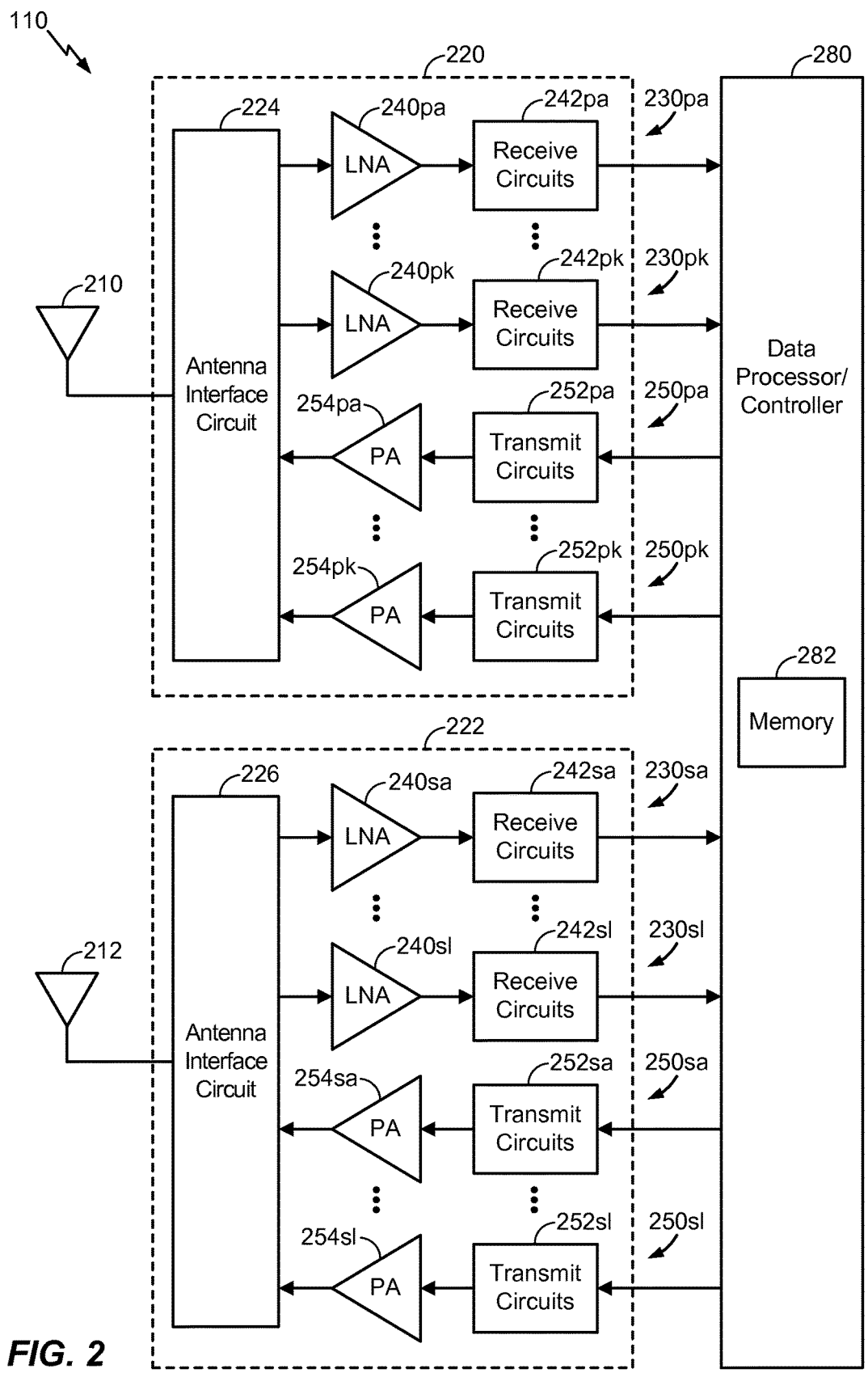
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to a primary antenna 210, a transceiver 222 coupled to a secondary antenna 212, and a data processor/controller 280. Transceiver 220 includes multiple (K) receivers 230pa to 230pk and multiple (K) transmitters 250pa to 250pk to support multiple frequency bands, multiple radio technologies, carrier aggregation, etc. Transceiver 222 includes multiple (L) receivers 230sa to 230sl and multiple (L) transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes an LNA 240 and receive circuits 242. For data reception, antenna 210 receives signals from base stations and/or other transmitter stations and provides a received RF signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver 230pa is the selected receiver. Within receiver 230pa, an LNA 240pa amplifies the input RF signal and provides an output RF signal. Receive circuits 242pa downconvert the output RF signal from RF to baseband, amplify and filter the downconverted signal, and provide an analog input signal to data processor 280. Receive circuits 242pa may include mixers, filters, amplifiers, matching circuits, an oscillator, a local oscillator (LO) generator, a phase locked loop (PLL), etc. Each remaining receiver 230 in transceivers 220 and 222 may operate in similar manner as receiver 230pa.

In the exemplary design shown in FIG. 2, each transmitter 250 includes transmit circuits 252 and a power amplifier (PA) 254. For data transmission, data processor 280 processes (e.g., encodes and modulates) data to be transmitted and provides an analog output signal to a selected transmitter. The description below assumes that transmitter 250pa is the selected transmitter. Within transmitter 250pa, transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224 and transmitted via antenna 210. Each remaining transmitter 250 in transceivers 220 and 222 may operate in similar manner as transmitter 250pa.

FIG. 2 shows an exemplary design of receiver 230 and transmitter 250. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 may be implemented on one module, which may be an RFIC, etc. The circuits in transceivers 220 and 222 may also be implemented in other manners. In an exemplary embodiment, the transceivers 220 and 222 may have a topology to enable analog built-in self test (BiST) as described with respect to FIGS. 3-7.

Data processor/controller 280 may perform various functions for wireless device 110. For example, data processor 280 may perform processing for data being received via receivers 230 and data being transmitted via transmitters 250. Controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Wireless device 110 may support multiple band groups, multiple radio technologies, and/or multiple antennas. Wireless device 110 may include a number of LNAs to support reception via the multiple band groups, multiple radio technologies, and/or multiple antennas.

Figure 3:
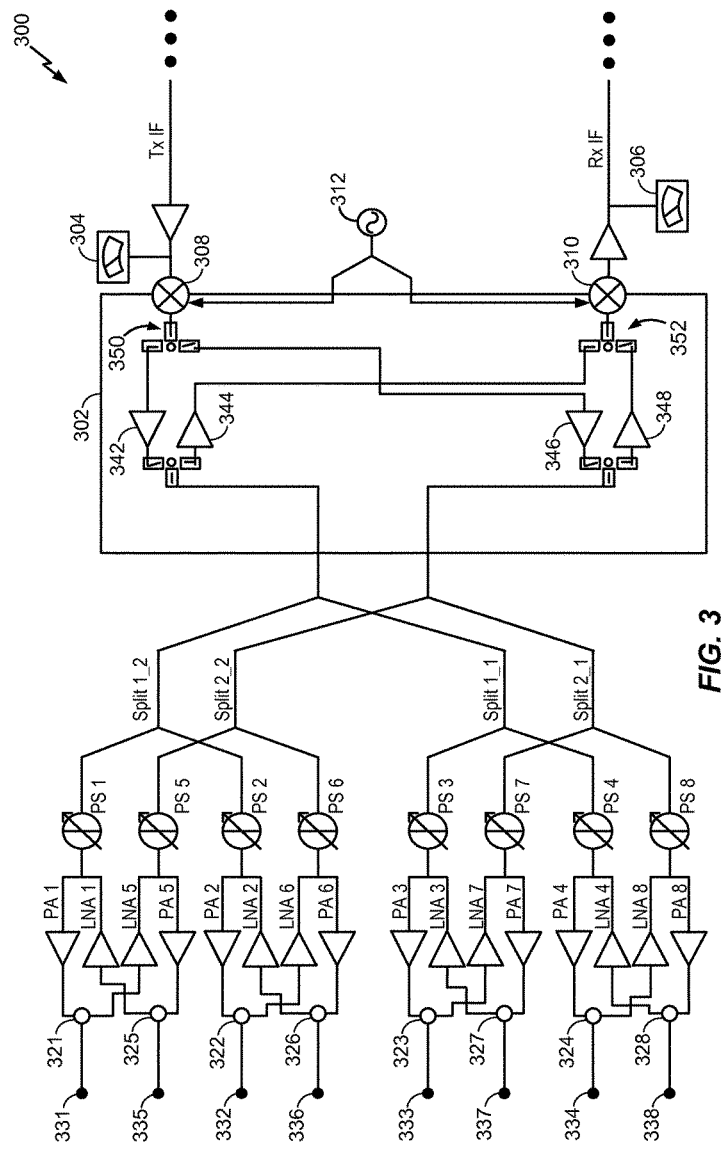
FIG. 3 is a diagram that depicts an exemplary embodiment of a transceiver having a topology that enables analog built-in self test (BiST)

Referring to FIG. 3, an exemplary embodiment of a transceiver 300 having a topology that enables an analog built-in self test (BiST) is shown. In an exemplary embodiment, the wireless device 110 of FIGS. 1-2 may include the transceiver 300. For example, the transceiver 300 may correspond to each of the transceivers 220, 222 of FIG. 2. The transceiver 300 may include a switching network 302, a first power sensor 304 (e.g., a radio-frequency power sensor), a second power sensor 306 (e.g., a radio-frequency power sensor), and a local oscillator 312. In the exemplary embodiment, the transceiver 300 also includes a first array of transceivers (Split 1_1, Split 1_2) and a second array of transceivers (Split 2_1, Split 2_2). For example, the transceiver 300 may be a multi-antenna array transceiver that is used for beam-forming mechanisms.

The first array of transceivers (Split 1_1, Split 1_2) may include a first transceiver, a second transceiver, a third transceiver, and a fourth transceiver. Each transceiver may include a corresponding power amplifier, low noise amplifier, and phase shifter. For example, the first transceiver may include a first power amplifier (PA 1), a first low noise amplifier (LNA 1), and a first phase shifter (PS 1). The first power amplifier (PA 1) is coupled to the first phase shifter (PS 1) via a first transmission path, and the first low noise amplifier (LNA 1) is coupled to the first phase shifter (PS 2) via a first reception path. The second transceiver may include a second power amplifier (PA 2), a second low noise amplifier (LNA 2), and a second phase shifter (PS 2). The second power amplifier (PA 2) is coupled to the second phase shifter (PS 2) via a second transmission path, and the second low noise amplifier (LNA 2) is coupled to the second phase shifter (PS 2) via a second reception path. The third transceiver may include a third power amplifier (PA 3), a third low noise amplifier (LNA 3), and a third phase shifter (PS 3). The third power amplifier (PA 3) is coupled to the third phase shifter (PS 3) via a third transmission path, and the third low noise amplifier (LNA 3) is coupled to the third phase shifter (PS 3) via a third reception path. The fourth transceiver may include a fourth power amplifier (PA 4), a fourth low noise amplifier (LNA 4), and a fourth phase shifter (PS 4). The fourth power amplifier (PA 4) is coupled to the fourth phase shifter (PS 4) via a fourth transmission path, and the fourth low noise amplifier (LNA 4) is coupled to the fourth phase shifter (PS 4) via a fourth reception path.

The second array of transceivers (Split 2_1, Split 2_2) may include a fifth transceiver, a sixth transceiver, a seventh transceiver, and an eighth transceiver. The fifth transceiver may include a fifth power amplifier (PA 5), a fifth low noise amplifier (LNA 5), and a fifth phase shifter (PS 5). The fifth power amplifier (PA 5) is coupled to the fifth phase shifter (PS 5) via a fifth transmission path, and the fifth low noise amplifier (LNA 5) is coupled to the fifth phase shifter (PS 5) via a fifth reception path. The sixth transceiver may include a sixth power amplifier (PA 6), a sixth low noise amplifier (LNA 6), and a sixth phase shifter (PS 6). The sixth power amplifier (PA 5) is coupled to the sixth phase shifter (PS 6) via a sixth transmission path, and the sixth low noise amplifier (LNA 6) is coupled to the sixth phase shifter (PS 6) via a sixth reception path. The seventh transceiver may include a seventh power amplifier (PA 7), a seventh low noise amplifier (LNA 7), and a seventh phase shifter (PS 7). The seventh power amplifier (PA 7) is coupled to the seventh phase shifter (PS 7) via a seventh transmission path, and the seventh low noise amplifier (LNA 7) is coupled to the seventh phase shifter (PS 7) via a seventh reception path. The eighth transceiver may include an eighth power amplifier (PA 8), an eighth low noise amplifier (LNA 8), and an eighth phase shifter (PS 8). The eighth power amplifier (PA 8) is coupled to the eighth phase shifter (PS 8) via an eighth transmission path, and the eighth low noise amplifier (LNA 5) is coupled to the eighth phase shifter (PS 8) via an eighth reception path.

Each power amplifier (PA 1-8) may be configured to amplify signals to be transmitted over a wireless network, such as a wireless network associated with the wireless system 120 of FIG. 1. Each low noise amplifier (LNA 1-8)

may be configured to amplify and improve the gain of signals received from the wireless network.

A power amplifier in the first array of transceivers (Split 1_1, Split 1_2) and a low noise amplifier in the second array of transceivers (Split 2_1, Split 2_2) may be coupled together via a three-state switch to enable analog BiST. For example, the first power amplifier (PA 1) may be coupled to the fifth low noise amplifier (LNA 5) via a first three-state switch 321, the second power amplifier (PA 2) may be coupled to the sixth low noise amplifier (LNA 6) via a second three-state switch 322, the third power amplifier (PA 3) may be coupled to the seventh low noise amplifier (LNA 7) via a third three-state switch 323, and the fourth power amplifier (PA 4) may be coupled to the eighth low noise amplifier (LNA 8) via a fourth three-state switch 324. Each three-state switch 321-324 may be coupled to a correspond antenna 331-334 (e.g., antenna element).

In a similar manner, a power amplifier in the second array of transceivers (Split 2_1, Split 2_2) and a low noise amplifier in the first array of transceivers (Split 1_1, Split 12) may be coupled together via a three-state switch to enable analog BiST. For example, the first low noise amplifier (LNA 1) may be coupled to the fifth power amplifier (PA 5) via a fifth three-state switch 325, the second low noise amplifier (LNA 2) may be coupled to the sixth power amplifier (PA 6) via a sixth three-state switch 326, the third low noise amplifier (LNA 3) may be coupled to the seventh power amplifier (PA 7) via a seventh three-state switch 327, and the fourth low noise amplifier (LNA 4) may be coupled to the eighth power amplifier (PA 8) via an eighth three-state switch 328. Each three-state switch 325-328 may be coupled to a correspond antenna 335-338 (e.g., antenna element).

Each three-state switch 321-328 may include a transmission state to transmit signals via the corresponding antennas 331-338, a reception state to receive signals via the corresponding antennas 331-338, and a loopback state to provide a transmission signal (e.g., a leakage current) from the corresponding power amplifier to the corresponding low noise amplifier to enable concurrent testing of transmission properties and reception properties. As a non-limiting example, during the loopback state, the first three-state switch 321 may provide a transmission signal from the first power amplifier (PA 1) to the fifth low noise amplifier (LNA 5) to enable concurrent testing of transmission properties of the first power amplifier (PA 1) and reception properties of the fifth low noise amplifier (LNA 5), as explained below.

The switching network 302 may include a first transmission driver 342, a first reception driver 344 (e.g., an attenuator), a second transmission driver 346, a second reception driver 348, a first diversity switch 350, and a second diversity switch 352. The first transmission driver 342 and the first reception driver 344 may be selectively coupled to the first array of transceivers (Split 1_1, Split 1_2) via a switch. For example, the first array of transceivers (Split 1_1, Split 1_2) may be coupled to the first transmission driver 342 to enable signal transmission via the corresponding power amplifiers (PA 1-4) during the transmission state or to enable transmission testing of the power amplifiers (PA 1-4) during the loopback state. Alternatively, the first array of transceivers (Split 1_1, Split 1_2) may be coupled to the first reception driver 344 to enable signal reception via the corresponding low noise amplifiers (LNA 1-4) or to enable reception testing of the low noise amplifiers (LNA 1-4) during the loopback mode.

The second transmission driver 346 and the second reception driver 348 may be selectively coupled to the second array of transceivers (Split 2_1, Split 2_2). For example, the second array of transceivers (Split 2_1, Split 2_2) may be coupled to the second transmission driver 346 to enable signal transmission via the corresponding power amplifiers (PA 5-8) during the transmission state or to enable transmission testing of the power amplifiers (PA 5-8) during the loopback state. Alternatively, the second array of transceivers (Split 2_1, Split 2_2) may be coupled to the second reception driver 348 to enable signal reception via the corresponding low noise amplifiers (LNA 5-8) or to enable reception testing of the low noise amplifiers (LNA 5-8) during the loopback mode.

The first diversity switch 350 may be configured to selectively couple a transmission path to the first transmission driver 342 or to the second transmission driver 346. For example, the first diversity switch 350 may be coupled to a first mixer 308 (e.g., a transmission mixer), and the first mixer 308 may be coupled to receive a local oscillator signal from the local oscillator 312. The first mixer 308 may be configured to mix the local oscillator signal with an intermediate frequency transmission signal (TX IF) from the transmission path to generate a transmission signal. The transmission signal may be provided to power amplifiers (PA 1-4) in the first array of transceivers (Split 1_1, Split 1_2) or to power amplifiers (PA 5-8) in the second array of transceivers (Split 2_1, Split 2_2) based on the state of the first diversity switch 350.

The second diversity switch 352 may be configured to selectively couple a reception path to the first reception driver 344 or to the second reception driver 348. For example, the second diversity switch 352 may be coupled to a second mixer 310, and the second mixer 310 may be coupled to receive the local oscillator signal from the local oscillator 312. The second mixer 310 may be configured to mix the local oscillator signal with a received signal to generate a received intermediate frequency signal (RX IF). The received signal may received from low noise amplifiers (LNA 1-4) in the first array of transceivers (Split 1_1, Split 1_2) or from low noise amplifiers (LNA 5-8) in the second array of transceivers (Split 2_1, Split 2_2) based on the state of the second diversity switch 352.

During the loopback state (e.g., loopback testing), the transceiver 300 may test transmission characteristics of power amplifiers in one array of transceivers and reception characteristics of low noise amplifiers in the other array or transceivers. Thus, characteristics of components (e.g. power amplifiers and low noise amplifiers) at the front-end of the transceiver 300 may be tested during the loopback testing (e.g., during analog BiST). As an illustrative example, if the first diversity switch 350 couples the first transmission driver 342 to the first mixer 308 and the second diversity switch 352 couples the second reception driver 348 to the second mixer 310 during the loopback state, the transceiver 300 may test transmission properties of the power amplifiers (PA 1-4) in the first array of transceivers (Split 1_1, Split 1_2) and reception properties of the low noise amplifiers (LNA 5-8) in the second array of transceivers (Split 2_1, Split 2_2). As another illustrative example, if the first diversity switch 350 couples the second transmission driver 346 to the first mixer 308 and the second diversity switch 352 couples the first reception driver 344 to the second mixer 310 during the loopback state, the transceiver 300 may test transmission properties of the power amplifiers (PA 5-8) in the second array of transceivers (Split 2_1, Split 2_2) and reception properties of the low noise amplifiers (LNA 1-4) in the first array of transceivers (Split 1_1, Split 1_2).

Testing of the transmission properties may be performed by coupling the first power sensor 304 to measure signal characteristics of the intermediate frequency transmission signal (TX IF), and testing of the reception properties may be performed by coupling the second power sensor 306 to measure signal characteristics of the received intermediate frequency signal (RX IF). The power sensors 304, 306 may measure (e.g., calculate) the power of the intermediate frequency transmission signal (TX IF), the gain of the intermediate frequency transmission signal (TX IF), the local oscillator leakage associated with the intermediate frequency transmission signal (TX IF), the linearity or output power (OP1dB) of the intermediate frequency transmission signal (TX IF), or any combination thereof. The power sensors 304, 306 may also measure the noise figure of the received intermediate frequency signal (RX IF), the gain of the received intermediate frequency signal (RX IF), the input power (IP1dB) of the received intermediate frequency signal (RX IF), or any combination thereof.

Although two power sensors 304, 306 are illustrated, in other exemplary embodiments, additional power sensors may be coupled to the transceiver 300 or to components of the transceiver 300 to enhance measurement reliability. As a non-limiting example, a power sensor may be coupled to the output of the first power amplifier (PA 1) (e.g., between the first power amplifier (PA 1) and the first three-state switch 321) to measure the output power of the first power amplifier (PA 1) with relatively high accuracy. As another non-limiting example, a power sensor may be coupled between the first array of the transceivers (Split 1_1) and the switching network 302 to enable power measurements prior to power leakage that may be attributed to components within the switching network 302.

In another exemplary embodiment, the transceiver 300 may test transmission characteristics of the transmission drivers 342, 346 and reception characteristics of the reception drivers 344, 348 during the loopback state. For example, the switch coupled to the output of the first transmission driver 342 and to the input of the first reception driver may also be a three-state switch. Thus, in a loopback state, the output of the first transmission driver 342 may be coupled to the input of the first reception driver 344 via the three-state switch such that leakage current from the first transmission driver 342 is provided to the first reception driver 344. In this configuration, the power sensors 304, 306 may measure transmission characteristics of the first transmission driver 342 and reception characteristics of the first reception driver 344 in a similar manner as described above.

During operation of a first exemplary embodiment of the loopback state (e.g., each three-state switch 321-328 is in the loopback state), testing of the power amplifiers (PA 1-4) in the first array of transceivers (Split 1_1, Split 1_2) and the low noise amplifiers (LNA 5-8) in the second array of transceivers (Split 2_1, Split 2_2) may be performed. For example, the first transmission driver 342 may be coupled to the first array of transceivers (Split 1_1, Split 1_2) and the second reception driver 348 may be coupled to the second array of transceivers (Split 2_1, Split 2_2). In addition, the first diversity switch 350 may couple the first transmission driver 342 to the first mixer 308, and the second diversity switch 352 may couple the second reception driver 348 to the second mixer 310.

The first mixer 308 may provide the transmission signal (e.g., the intermediate frequency transmission signal (TX IF) mixed with the local oscillator signal) to each power amplifier (PA 1-4) via the first transmission driver 342. The power amplifiers (PA 1-4) may amplify the transmission signal and provide an amplified transmission signal (e.g., a radio frequency transmission signal) to the corresponding low noise amplifiers (LNA 5-8) based on the three-state switches 321-328, as described in greater detail with respect to FIG. 4. For example, the first power amplifier (PA 1) may provide the amplified transmission signal to the fifth low noise amplifier (LNA 5), the second power amplifier (PA 2) may provide the amplified transmission signal to the sixth low noise amplifier (LNA 6), the third power amplifier (PA 3) may provide the amplified transmission signal to the seventh low noise amplifier (LNA 7), and the fourth power amplifier (PA 4) may provide the amplified transmission signal to the eighth low noise amplifier (LNA 8).

The low noise amplifiers (LNA 5-8) may be configured to amplify the amplified transmission signals to generate the received signals. The received signals may be provided to the second reception driver 348 and to the second mixer 310 via the second diversity switch 352. The second mixer 310 may generate the received intermediate frequency signal (RX IF) by mixing the received signals with the local oscillator signal. The power detectors 304, 306 may measure signal qualities of the intermediate frequency transmission signal (TX IF) and the received intermediate frequency signal (RX IF), respectively, as described above.

During operation of a second exemplary embodiment of the loopback state (e.g., each three-state switch 321-328 is in the loopback state), simultaneous testing of the power amplifiers (PA 5-8) in the second array of transceivers (Split 2_1, Split 2_2) and the low noise amplifiers (LNA 1-4) in the first array of transceivers (Split 1_1, Split 1_2) may be performed. For example, the first reception driver 344 may be coupled to the first array of transceivers (Split 1_1, Split 1_2) and the second transmission driver 346 may be coupled to the second array of transceivers (Split 2_1, Split 2_2). In addition, the first diversity switch 350 may couple the second transmission driver 346 to the first mixer 308, and the second diversity switch 352 may couple the first reception driver 344 to the second mixer 310.

The first mixer 308 may provide the transmission signal (e.g., the intermediate frequency transmission signal (TX IF) mixed with the local oscillator signal) to each power amplifier (PA 5-8) via the second transmission driver 346. The power amplifiers (PA 5-8) may amplify the transmission signal and provide the amplified transmission signal (e.g., a radio frequency transmission signal) to the corresponding low noise amplifiers (LNA 1-4) based on the three-state switches 321-328, as described in greater detail with respect to FIG. 4. For example, the fifth power amplifier (PA 5) may provide the amplified transmission signal to the first low noise amplifier (LNA 1), the sixth power amplifier (PA 6) may provide the amplified transmission signal to the second low noise amplifier (LNA 2), the seventh power amplifier (PA 7) may provide the amplified transmission signal to the third low noise amplifier (LNA 3), and the eighth power amplifier (PA 8) may provide the amplified transmission signal to the fourth low noise amplifier (LNA 4).

The low noise amplifiers (LNA 1-4) may be configured to amplify the amplified transmission signals to generate the received signals. The received signals may be provided to the first reception driver 344 and to the second mixer 310 via the second diversity switch 352. The second mixer 310 may generate the received intermediate frequency signal (RX IF) by mixing the received signals with the local oscillator signal. The power detectors 304, 306 may measure signal characteristics of the intermediate frequency transmission signal (TX IF) and the received intermediate frequency signal (RX IF), respectively, as described above.

The topology of the transceiver 300 enables properties of the power amplifiers (PA 1-8) and properties of the low noise amplifiers (LNA 1-8) to be determined based on metric values determined by the power sensors 304, 306. For example, the transceiver 300 topology supports a leakage path between a power amplifier (e.g., the first power amplifier (PA 1)) in a particular transceiver and a low noise amplifier (e.g., the fifth low noise amplifier (LNA 5)) in another transceiver to incorporate BiST (e.g., loopback testing). Thus, the topology of the transceiver 300 enables analog BiST of the power amplifiers (PA 1-8) and the low noise amplifiers (LNA 1-8) at the front-end.

In an exemplary embodiment, the transceiver 300 may be implemented on a radio frequency/intermediate frequency (RF/IF) converter chip. For example, the analog BiST may be performed with the power sensors 304, 306 to monitor performance.

Figure 4:
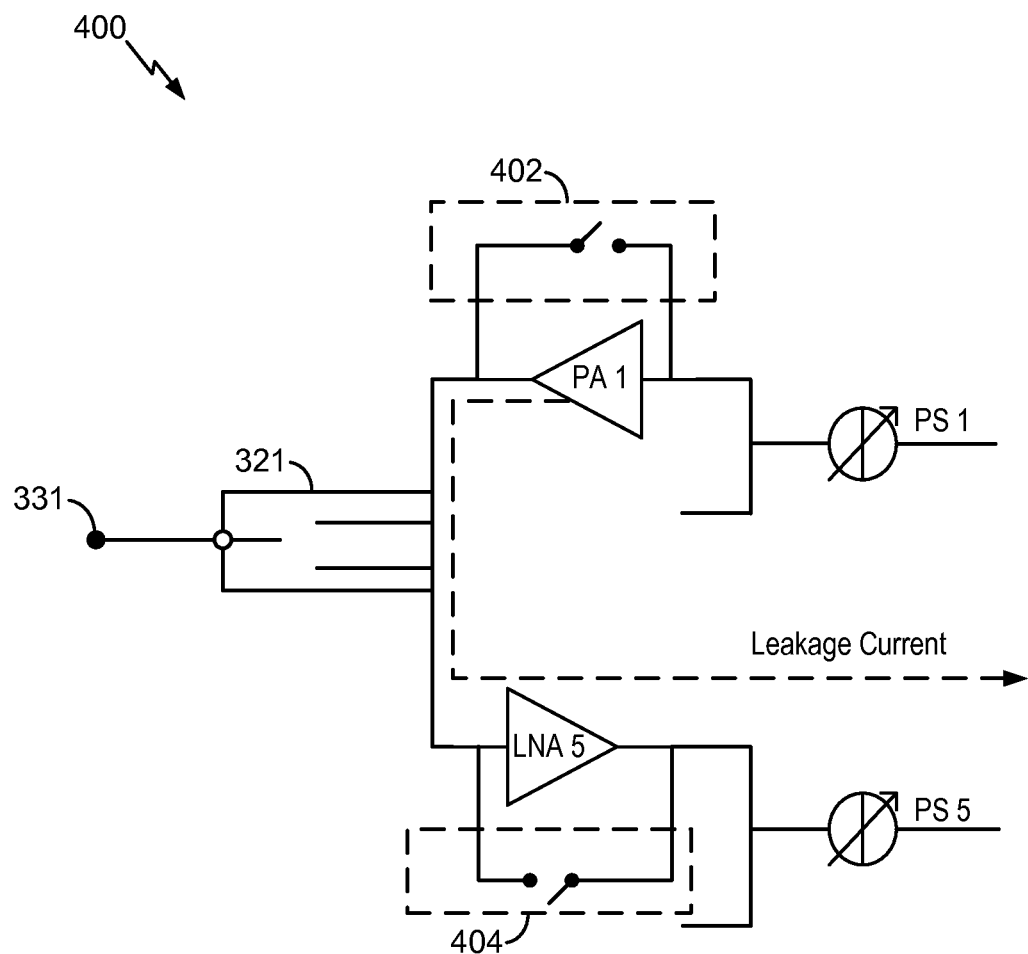
FIG. 4 is a diagram that depicts an exemplary embodiment of an antenna chain of a transceiver having a topology that enables analog BiST.

Referring to FIG. 4, an exemplary embodiment of an antenna chain 400 of a transceiver (e.g., the transceiver 300) having a topology that enables analog built-in self test (BiST) is shown. The antenna chain 400 includes the first power amplifier (PA 1) in the first array of transceivers (Split 1_1, Split 1_2) and the fifth low noise amplifier (LNA 5) in the second array of transceivers (Split 2_1, Split 2_2). It should be noted that the topology of the other antenna chains of the transceiver 300 are substantially similar to the topology of the antenna chain 400 depicted in FIG. 4.

The first power amplifier (PA 1) may be coupled to the first three-state switch 321, and the low noise amplifier (LNA 5) may also be coupled to the first three-state switch 321. The first three-state switch 321 may also be coupled to the first antenna 331. The first phase shifter (PS 1) may be coupled to the input of the first power amplifier (PA 1), and the fifth phase shifter (PS 5) may be coupled to the output of the fifth low noise amplifier (LNA 5).

The first three-state switch 321 may be configured to switch to a transmission state, a reception state, or a loopback state. For example, during the transmission state, the first three-state switch 321 couples the first antenna 331 to the output of the first power amplifier (PA 1). During the transmission state, the first power amplifier (PA 1) may be configured to amplify a transmission signal to generate a radio frequency transmission signal. The radio frequency transmission signal may be transmitted over a wireless network (not shown) via the first antenna 331.

During the reception state, the first three-state switch 321 couples the first antenna 331 to the input of the fifth low noise amplifier (LNA 5). A received radio frequency signal may be provided to the fifth low noise amplifier (LNA 5) via the first antenna 331 during the reception state. The fifth low noise amplifier (LNA 5) may be configured to amplify and adjust the gain of the received radio frequency signal to generate a received signal.

During the loopback state, the first three-state switch 321 may couple the output of the first power amplifier (PA 1) to the input of the fifth low noise amplifier (LNA 5). A radio frequency transmission signal generated at the first power amplifier (PA 1) may be provided to the fifth low noise amplifier (LNA 5) as a leakage current. For example, during the loopback state, the antenna chain 400 foregoes transmitting or receiving radio frequency signals and generates the leakage current from the first power amplifier (PA 1). The leakage current may be provided to the fifth low noise amplifier (LNA 5), amplified at the fifth low noise amplifier (LNA 5), and used as a received signal to enable analog BiST at the front-end, as described with respect to FIG. 3. For example, measurements at the second power sensor 306 may be based on the leakage current.

In an exemplary embodiment, a first bypass circuit 402 may enable particular measurements for the first power amplifier (PA 1). For example, selectively enabling the first bypass circuit 402 (e.g., closing the switch) may enable the first power detector 304 to measure the power of the transmission signal prior to and after power amplification to determine the gain associated with the first power amplifier (PA 1). In a similar manner, a second bypass circuit 404 may enable particular measurements for the fifth low noise amplifier (LNA 5). For example, selectively enabling the second bypass circuit 404 may enable the second power detector 306 to measure the power of the received signal prior to amplification and after amplification to determine the gain associated with the fifth low noise amplifier (LNA 5).

Figure 5:
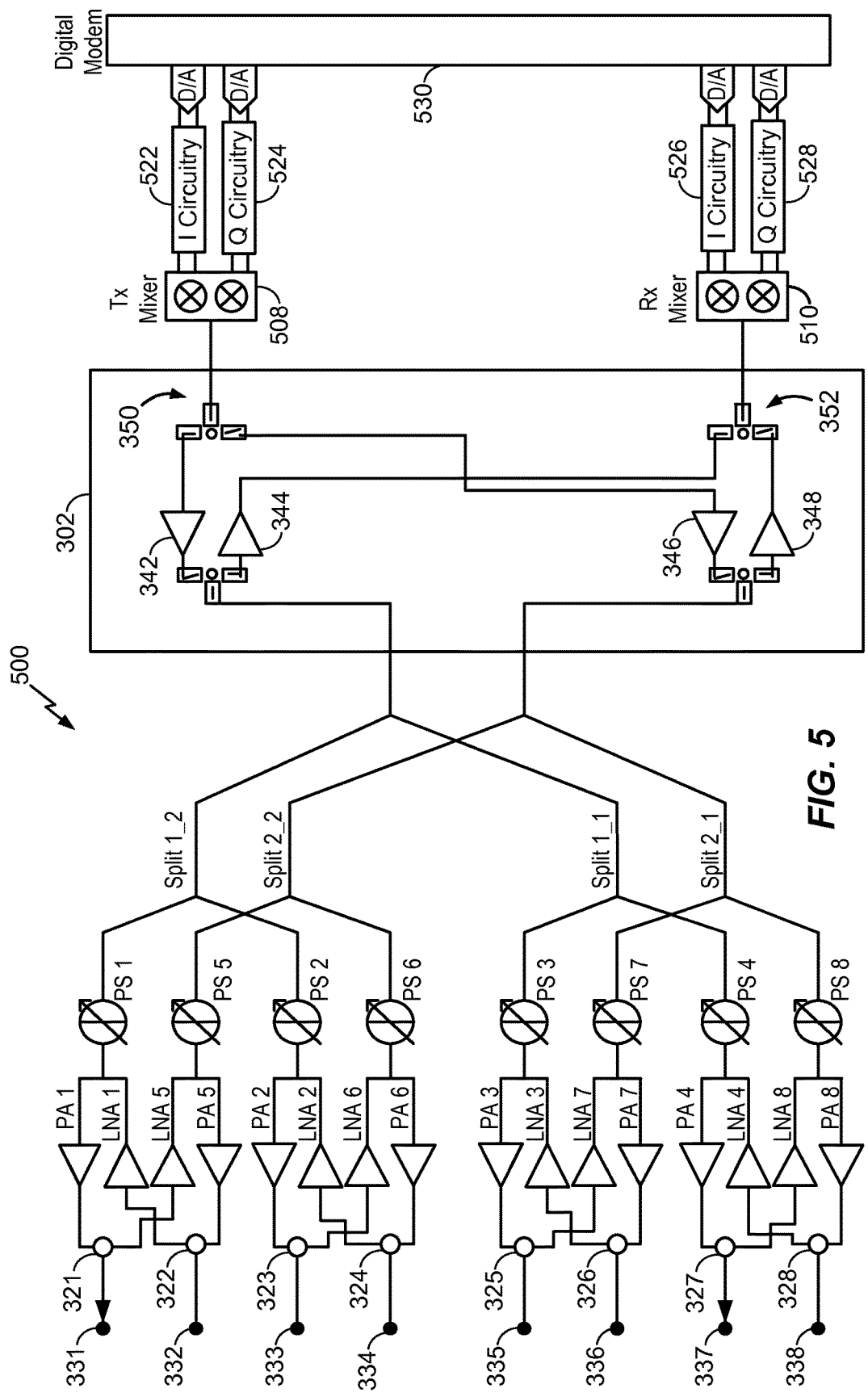
FIG. 5 is a diagram that depicts another exemplary embodiment of a transceiver having a topology that enables analog BiST.

Referring to FIG. 5, another exemplary embodiment of a transceiver 500 having a topology that enables analog built-in self test (BiST) is shown. The transceiver 500 may include the switching network 302, the first array of transceivers (Split 1_1, Split 1_2), and the second array of transceivers (Split 2_1, Split 2_2).

The first diversity switch 350 may be coupled to a pair of transmission mixers 508. For example, the pair of transmission mixers 508 may include an in-phase transmission mixer and a quadrature transmission mixer. The in-phase transmission mixer may be coupled to in-phase transmission circuitry 522, and the quadrature transmission mixer may be coupled to quadrature transmission circuitry 524. In an exemplary embodiment, the in-phase transmission circuitry 522 may include an in-phase video graphics array (VGA) transmitter and an image rejection filter. In another exemplary embodiment, the quadrature transmission circuitry 524 may include a quadrature VGA transmitter and an image rejection filter. The in-phase transmission circuitry 522 and the quadrature transmission circuitry 524 may be coupled to a digital modem 530 via digital-to-analog converters.

The second diversity switch 352 may be coupled to a pair of reception mixers 510. For example, the pair of reception mixers 510 may include an in-phase reception mixer and a quadrature reception mixer. The in-phase reception mixer may be coupled to in-phase reception circuitry 526, and the quadrature reception mixer may be coupled to quadrature reception circuitry 528. In an exemplary embodiment, the in-phase reception circuitry 526 may include an in-phase VGA receiver and an anti-aliasing filter. In another exemplary embodiment, the quadrature reception circuitry 528 may include a quadrature VGA receiver and an anti-aliasing filter. The in-phase reception circuitry 526 and the quadrature reception circuitry 528 may be coupled to the digital modem 530 via analog-to-digital converters.

The digital modem 530 (or a digital signal processor) may be configured to generate transmission signals (e.g., transmission signals) and may detect signals (e.g., received signals). In an exemplary embodiment, the digital modem 530 may measure signal characteristics of the transmission signals and the received signals during analog BiST. Additional power sensors may also be coupled to the signal paths to monitor signal characteristics in greater detail.

In an exemplary embodiment, the transceiver 500 may be implemented on a zero intermediate frequency (ZIF) converter chip. For example, analog BiST may be performed with the digital modem 530 to monitor performance of the power amplifiers (PA 1-8) and the low noise amplifiers (LNA 1-8).

Figure 6:
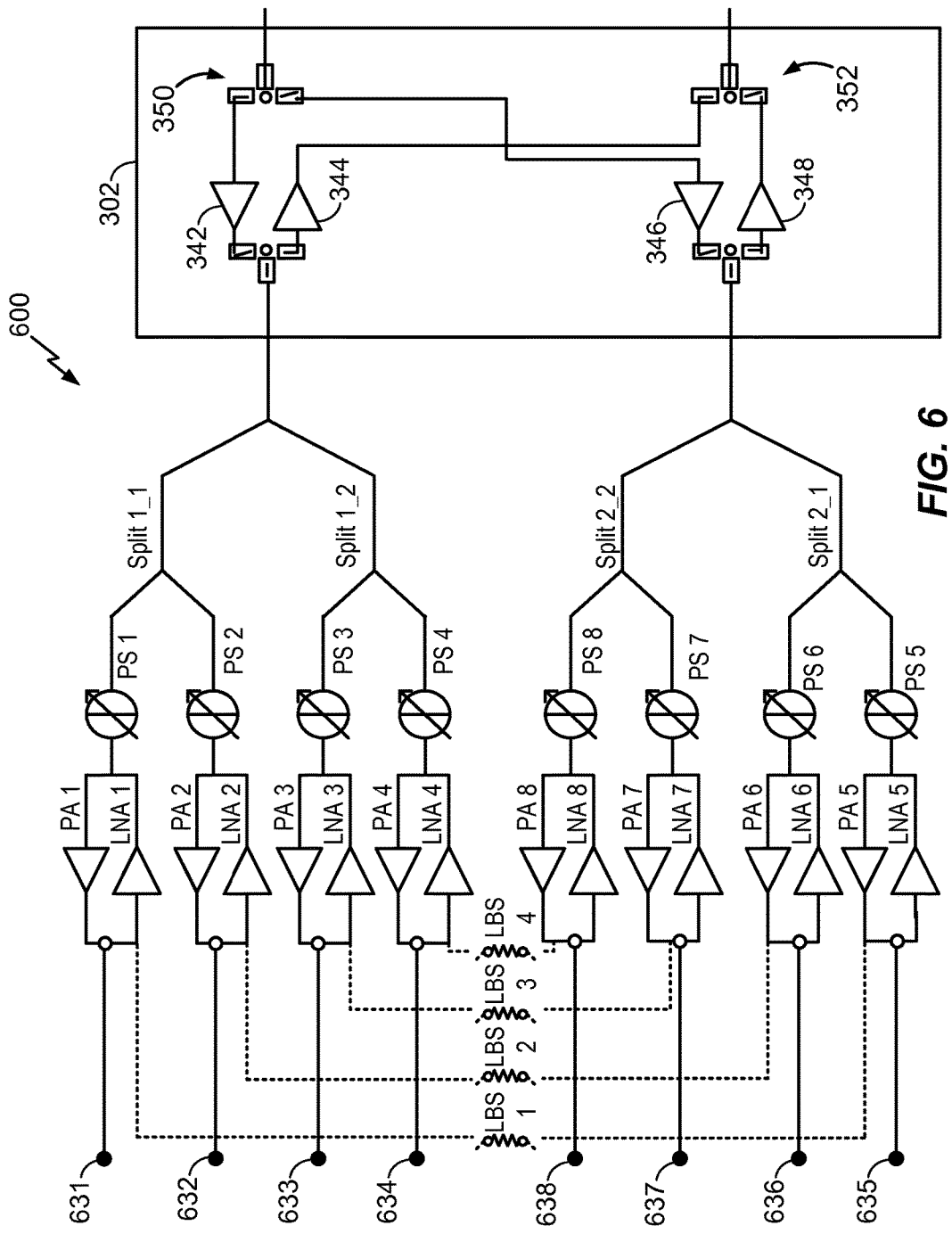
FIG. 6 is a diagram that depicts another exemplary embodiment of a transceiver 600 having a topology that enables analog BIST.

Referring to FIG. 6, another exemplary embodiment of a transceiver 600 having a topology that enables analog built-in self test (BiST) is shown. The transceiver 600 includes the switching network 302, the first array of transceivers (Split 1_1, Split 1_2), and the second array of transceivers (Split 2_1, Split 2_2).

In the first array of transceivers (Split 1_1, Split 1_2), a first antenna 631 is coupled to an output of the first power amplifier (PA 1) and to an input of the first low noise amplifier (LNA 1), a second antenna 632 is coupled to an output of the second power amplifier (PA 2) and to an input of the second low noise amplifier (LNA 2), a third antenna 633 is coupled to an output of the third power amplifier (PA 3) and to an input of the third low noise amplifier (LNA 3), and a fourth antenna 634 is coupled to an output the fourth power amplifier (PA 4) and to an input of the fourth low noise amplifier (LNA 4).

In the second array of transceivers (Split 2_1, Split 2_2), a fifth antenna 635 is coupled to an output of the fifth power amplifier (PA 5) and to an input of the fifth low noise amplifier (LNA 6), a sixth antenna 636 is coupled to an output of the sixth power amplifier (PA 6) and to an input of the sixth low noise amplifier (LNA 6), a seventh antenna 637 is coupled to an output of the seventh power amplifier (PA 7) and to an input of the seventh low noise amplifier (LNA 7), and an eighth antenna 638 is coupled to an output the eighth power amplifier (PA 8) and to an input of the eighth low noise amplifier (LNA 8).

During a loopback state (e.g., during analog BiST), a first loopback switch (LBS 1) may selectively couple the first power amplifier (PA 1) to the fifth low noise amplifier (LNA 5) to enable a feedback current to propagate from the first power amplifier (PA 1) to the fifth low noise amplifier (LNA 5), as described with respect to FIG. 4. The first loopback switch (LBS) may also selectively couple the fifth power amplifier (PA 5) to the first low noise amplifier (LNA 1) to enable a feedback current to propagate from the fifth power amplifier (PA 1) to the first low noise amplifier (LNA 1).

In a substantially similar manner, during the loopback state, a second loopback switch (LBS 2) may selectively couple the second power amplifier (PA 2) to the sixth low noise amplifier (LNA 6) or may couple the sixth power amplifier (PA 6) to the second low noise amplifier (LNA 2). A third loopback switch (LBS 3) may selectively couple the third power amplifier (PA 3) to the seventh low noise amplifier (LNA 7) or may couple the seventh power amplifier (PA 7) to the third low noise amplifier (LNA 3). A fourth loopback switch (LBS 4) may selectively couple the fourth power amplifier (PA 4) to the eighth low noise amplifier (LNA 8) or may couple the eighth power amplifier (PA 8) to the fourth low noise amplifier (LNA 4).

It will be appreciated that the array chain topology of the transceiver 600 in FIG. 6 may be implemented with the transceiver 300 of FIG. 3 or the transceiver 500 of FIG. 5. For example, the array chain topology of the transceiver 600 may be implemented on a radio frequency/intermediate frequency (RF/IF) converter chip. For example, analog BiST may be performed with the power sensors 304, 306 of FIG. 3 to monitor performance of the power amplifiers (PA 1-8) and the low noise amplifiers (LNA 1-8). Alternatively, the array chain topology of the transceiver 600 may be implemented on a zero intermediate frequency (ZIF) converter chip. For example, the analog BiST may be performed with the digital modem 530 to monitor performance.

Figure 7:
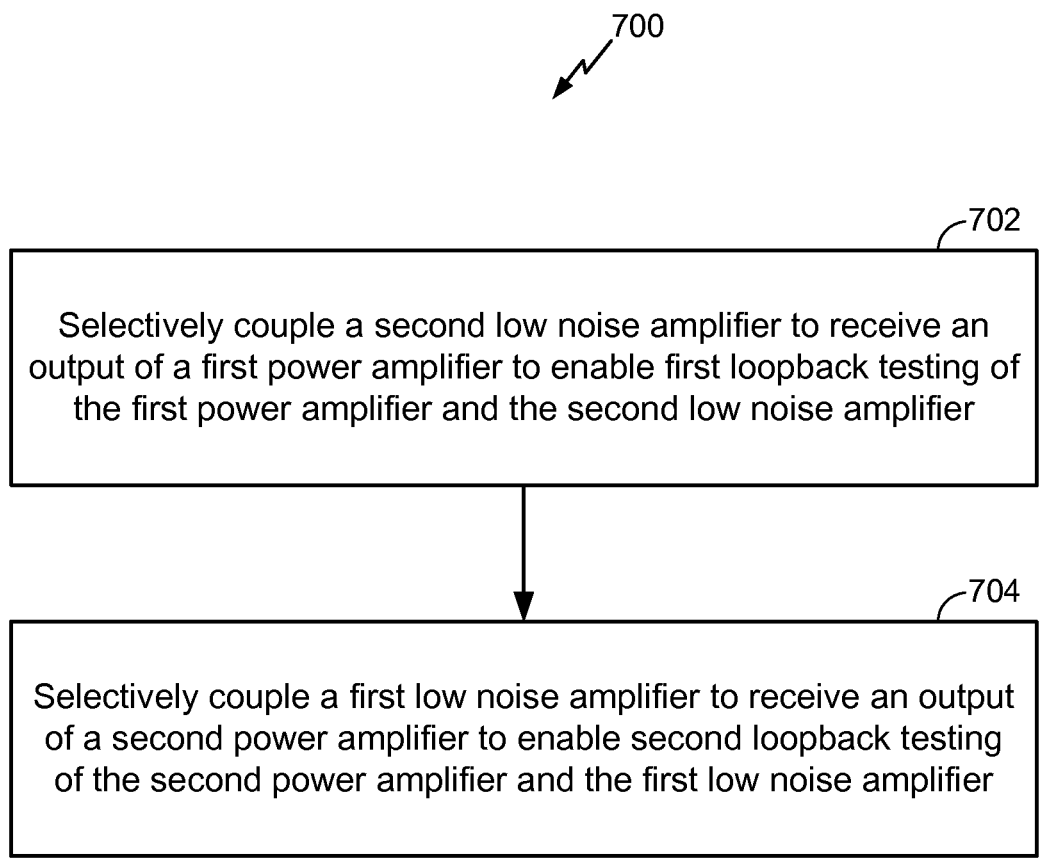
FIG. 7 is a flowchart that illustrates an exemplary embodiment of a method for enabling analog built-in self testing for transceiver components.

Referring to FIG. 7, a flowchart illustrates an exemplary embodiment of a method 700 for enabling analog built-in self testing for transceiver components. The method 700 may be performed using the wireless device 110 of FIGS. 1-2, the transceiver 300 of FIG. 3, the antenna chain 400 of FIG. 4, the transceiver 500 of FIG. 5, the transceiver 600 of FIG. 6, or any combination thereof.

The method 700 includes selectively coupling a second low noise amplifier to receive an output of a first power amplifier to enable loopback testing, at 702. For example, referring to FIG. 3, the first power amplifier (PA 1) may be coupled to the fifth low noise amplifier (LNA 5) via the first three-state switch 321 to enable loopback testing.

The first low noise amplifier may be selectively coupled to receive an output of the second power amplifier to enable loopback testing, at 704. For example, referring to FIG. 3, the fifth power amplifier (PA 5) may be coupled to the first low noise amplifier (LNA 1) via the second three-state switch 322 to enable loopback testing.

In an exemplary embodiment, the method 700 may include determining characteristics of the first power amplifier during loopback testing. For example, referring to FIG. 3, characteristics of the first power amplifier (PA 1) may be determined (e.g., measured using the first power sensor 304) during loopback testing. As another example, referring to FIG. 6, characteristics of the first power amplifier (PA 1) may be determined (e.g., measured using a power sensor (not shown) coupled to the first array of transceivers (Split 1_1, Split 1_2)) during loopback testing. The method 700 may also include simultaneously determining characteristics of the second low noise amplifier during loopback testing. For example, referring to FIG. 3, characteristics of the fifth low noise amplifier (LNA 5) may be determined (e.g., measured using the second power sensor 306) during loopback testing when the characteristics of the first power amplifier (PA 1) are being determined. As another example, referring to FIG. 6, characteristics of the fifth low noise amplifier (LNA 5) may be determined (e.g., measured using a power sensor (not shown) coupled to the second array of transceivers (Split 2_1, Split 2_2)) during loopback testing when characteristics of the first power amplifier (PA 1) are being determined.

In an exemplary embodiment, the method 700 may include selectively coupling the first power amplifier to a first antenna to enable signal transmission via the first antenna. For example, referring to FIG. 6, the first loopback switch (LBS 1) may be deactivated (e.g., open). The first power amplifier (PA 1) may be coupled to the first antenna 631. Signal transmission via the first antenna 631 may be enabled using the first power amplifier (PA 1) and the first transmission path. The method 700 may also include selectively coupling the second low noise amplifier to a second antenna to enable simultaneous signal reception via the second antenna. For example, referring to FIG. 6, the fifth low noise amplifier (LNA 5) may be coupled to the fifth antenna 635 when the first loopback switch (LBS 1) is deactivated. Signal reception via the fifth antenna 635 may be enabled using the fifth low noise amplifier (LNA 5) and the fifth reception path. It will be appreciated that signal transmission may be enabled for each power amplifier (PA 1-4) in the first array of transceivers (Split 1_1, Split 1_2) while signal reception is simultaneously enabled for each low noise amplifier (LNA 5-8) in the second array of transceivers (Split 2_1, Split 2_2).

The method 700 of FIG. 7 may enable properties of the power amplifiers (PA 1-8) and properties of the low noise amplifiers (LNA 1-8) to be determined and calibrated based on measured metric values (e.g., power, gain, local oscillator leakage, linearity, etc.) determined by the power sensors 304, 306 or the digital modem 530. The method 700 enables a topology that supports analog BiST of the power amplifiers (PA 1-8) and the low noise amplifiers (LNA 1-8) at the front-end of the transceiver 300.

In conjunction with the described embodiments, an apparatus includes first means for amplifying a transmission signal. For example, the first means for amplifying the transmission signal may include the first power amplifier (PA 1) of FIGS. 3-6, the second power amplifier (PA 2) of FIGS. 3, 5, and 6, the third power amplifier (PA 3) of FIGS. 3, 5, and 6, the fourth power amplifier (PA 4) of FIGS. 3, 5, and 6, one or more other devices, circuits, modules, or instructions to amplify the transmission signal, or any combination thereof.

The apparatus may also include first means for amplifying a received signal. For example, the first means for amplifying the received signal may include the first low noise amplifier (LNA 1) of FIGS. 3, 5, and 6, the second low noise amplifier (LNA 2) of FIGS. 3, 5, and 6, the third low noise amplifier (LNA 3) of FIGS. 3, 5, and 6, the fourth low noise amplifier (LNA 4) of FIGS. 3, 5, and 6, one or more other devices, circuits, modules, or instructions to amplify the received signal, or any combination thereof. A first transceiver may include the first means for amplifying the transmission signal and the first means for amplifying the received signal.

The apparatus may also include second means for amplifying a transmission signal. For example, the second means for amplifying the transmission signal may include the fifth power amplifier (PA 5) of FIGS. 3, 5, and 6, the sixth power amplifier (PA 6) of FIGS. 3, 5, and 6, the seventh power amplifier (PA 7) of FIGS. 3, 5, and 6, the eighth power amplifier (PA 8) of FIGS. 3, 5, and 6, one or more other devices, circuits, modules, or instructions to amplify the transmission signal, or any combination thereof.

The apparatus may also include second means for amplifying a received signal. For example, the second means for amplifying the received signal may include the fifth low noise amplifier (LNA 5) of FIGS. 3-6, the sixth low noise amplifier (LNA 6) of FIGS. 3, 5, and 6, the seventh low noise amplifier (LNA 7) of FIGS. 3, 5, and 6, the eighth low noise amplifier (LNA 8) of FIGS. 3, 5, and 6, one or more other devices, circuits, modules, or instructions to amplify the received signal, or any combination thereof. A second transceiver may include the second means for amplifying the transmission signal and the second means for amplifying the received signal.

The apparatus may also include means for selectively coupling the second means for amplifying the received signal to receive an output of the first means for amplifying the transmission signal to enable loopback testing. For example, the means for selectively coupling may include one or more of the three-state switches 321-328 of FIGS. 3 and 5, the first three-state switch 321 of FIG. 4, one or more of the loopback switches (LBS 1-LBS 4) of FIG. 6, one or more other devices, circuits, modules, or instructions to selectively couple the second means for amplifying the received signal to receive the output of the first means for amplifying the transmission signal, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a first power amplifier coupled to a first transmission path of a first transceiver;
a first low noise amplifier coupled to a first reception path of the first transceiver;
a second power amplifier coupled to a second transmission path of a second transceiver;
a second low noise amplifier coupled to a second reception path of the second transceiver;
a first switch configurable in at least three states, the first switch configured, while in a first state, to couple the second low noise amplifier to an output of the first power amplifier, wherein the first switch is configured, while in a second state, to couple the first power amplifier to a first antenna to transmit signals over a wireless network, and wherein the first switch is configured, while in a third state, to couple the second low noise amplifier to the first antenna; and
a second switch configured to selectively couple the first low noise amplifier to receive an output of the second power amplifier.

2. The apparatus of claim 1, wherein the first transceiver is included in a first array comprising multiple transceivers, and wherein the second transceiver is included in a second array comprising multiple transceivers.

3. The apparatus of claim 1, wherein the first power amplifier is configured to be selectively coupled to the first antenna to enable signal transmission over the first antenna via the first transmission path, and wherein the second low noise amplifier is selectively coupled to the first antenna to enable signal reception over the first antenna via the second reception path.

4. The apparatus of claim 1, wherein the first power amplifier and the second low noise amplifier are configured to be selectively coupled to the first antenna via the first switch, and wherein the first low noise amplifier and the second power amplifier are configured to be selectively coupled to a second antenna via the second switch.

5. The apparatus of claim 1, wherein loopback testing is enabled when the second low noise amplifier is coupled to receive the output of the first power amplifier.

6. The apparatus of claim 1, wherein loopback testing is enabled when the first low noise amplifier is coupled to receive the output of the second power amplifier.

7. The apparatus of claim 1, wherein the first switch is configured, while in the first state, to couple the second low noise amplifier to the output of the first power amplifier via a path that bypasses the first antenna.

8. The apparatus of claim 1, wherein the second switch is configured, while in a loopback state, to couple the first low noise amplifier to the output of the second power amplifier via a path that omits a second antenna coupled to the second switch.

9. The apparatus of claim 1, wherein the first state comprises a loopback state, wherein the second state comprises a transmission state, and wherein the third state of the first switch comprises a reception state.

10. The apparatus of claim 1, wherein the first switch and the second switch comprise three-state switches, wherein the second switch is configured, while in a first state, to couple the first low noise amplifier to an output of the second power amplifier, wherein the second switch is configured, while in a second state, to couple the second power amplifier to a second antenna to transmit signals over the wireless network, and wherein the second switch is configured, while in a third state, to couple the first low noise amplifier to the second antenna to receive signals transmitted over the wireless network.

11. The apparatus of claim 1, further comprising a first bypass circuit coupled to an input terminal of the first power amplifier and coupled to an output terminal of the first power amplifier, the first bypass circuit configured to selectively enable gain measurements during loopback testing.

12. The apparatus of claim 1, further comprising a second bypass circuit coupled to an input terminal of the second low noise amplifier and coupled to an output terminal of the second low noise amplifier, the second bypass circuit configured to selectively enable gain measurements during loopback testing.

13. An apparatus comprising:
a first power amplifier coupled to a first transmission path;
a first low noise amplifier coupled to a first reception path;
a second power amplifier coupled to a second transmission path;
a second low noise amplifier coupled to a second reception path;
a first switch configured to selectively couple the second low noise amplifier to an output of the first power amplifier, wherein the first switch is configured to selectively couple the first power amplifier to a first antenna to transmit signals over a wireless network;
a second switch configured to selectively couple the first low noise amplifier to receive an output of the second power amplifier;
a first bypass circuit coupled to an input terminal of the first power amplifier and coupled to an output terminal of the first power amplifier; and
a second bypass circuit coupled to an input terminal of the second low noise amplifier and coupled to an output terminal of the second low noise amplifier,
wherein, during loopback testing, the first bypass circuit and the second bypass circuit are selectively enabled to enable gain measurements.

14. A method comprising:
coupling, via a first switch in a first state, a second low noise amplifier of a second transceiver to an output of a first power amplifier of a first transceiver to enable first loopback testing of the first power amplifier and the second low noise amplifier, wherein the first switch is configurable in at least three states, wherein the first switch, while in a second state, couples the first power amplifier to a first antenna to transmit wireless signals over a wireless network, and wherein the first switch, while in a third state, couples the second low noise amplifier to the first antenna; and
selectively coupling a first low noise amplifier of the first transceiver to receive an output of a second power amplifier of the second transceiver to enable second loopback testing of the second power amplifier and the first low noise amplifier.

15. The method of claim 14, further comprising:
determining characteristics of the first power amplifier during the first loopback testing; and
determining characteristics of the second low noise amplifier during the first loopback testing.

16. The method of claim 14, wherein coupling the second low noise amplifier to the first antenna enables signal reception via the first antenna.

17. The method of claim 14, wherein the first low noise amplifier is coupled to the output of the second power amplifier via a second switch while in a first state, the second switch comprising a three-state switch, and wherein the second power amplifier is coupled to a second antenna via the second switch while in a second state.

18. An apparatus comprising:
first means for amplifying a transmission signal and first means for amplifying a received signal, the first means for amplifying the transmission signal and the first means for amplifying the received signal included in a first transceiver;
second means for amplifying a transmission signal and second means for amplifying a received signal, the second means for amplifying the transmission signal and the second means for amplifying the received signal included in a second transceiver;
first means for coupling, while in a first state, the second means for amplifying the received signal to an output of the first means for amplifying the transmission signal, the first means for coupling configurable in at least three states, wherein the first means for coupling is configured, while in a second state, to couple the first means for amplifying the transmission signal to a first antenna to transmit signals over a wireless network, and wherein the first means for coupling is configured, while in a third state, to couple the second means for amplifying the received signal to the first antenna; and second means for selectively coupling the first means for amplifying the received signal to receive an output of the second means for amplifying the transmission signal.

19. The apparatus of claim 18, wherein the first means for coupling comprises a three-state switch.

* * * * *